United States Patent [19]

Adams et al.

[11] Patent Number: 4,598,333
[45] Date of Patent: Jul. 1, 1986

[54] PRINTED WIRING BOARD MEANS WITH INTEGRAL DEW SENSOR

[75] Inventors: John T. Adams; John E. Bohan, Jr., both of Minneapolis, Minn.

[73] Assignee: Honeywell Inc., Minneapolis, Minn.

[21] Appl. No.: 775,476

[22] Filed: Sep. 12, 1985

[51] Int. Cl.⁴ .................. H01G 5/20; H01H 29/00; H01H 35/18

[52] U.S. Cl. .................. 361/286; 200/61.04; 307/118

[58] Field of Search .......... 361/286; 307/118; 200/61.04

[56] References Cited

U.S. PATENT DOCUMENTS

| | | | |
|---|---|---|---|
| 3,333,258 | 7/1967 | Walker et al. | 340/244 |
| 3,525,902 | 8/1970 | Davidson et al. | 200/61.04 |
| 3,624,541 | 11/1971 | Lundstrom | 331/65 |
| 3,794,847 | 2/1974 | Cadiou | 307/117 |
| 3,898,423 | 8/1975 | Taylor et al. | 307/118 X |
| 3,949,389 | 4/1976 | Monk et al. | 340/235 |
| 4,322,777 | 3/1982 | Ueta et al. | 361/397 |
| 4,369,479 | 1/1983 | Rickard | 361/1 |

OTHER PUBLICATIONS

Honeywell Installation and Instruction Sheet–Form Number 68-0044-2, Revised Sep. 1984, entitled Hot Surface Ignition Control.

*Primary Examiner*—Donald A. Griffin
*Attorney, Agent, or Firm*—Alfred N. Feldman

[57] ABSTRACT

An electronic control device utilizes a plurality of conductive areas on an associated printed wiring board to create integral dew sensors. The dew sensors are created by providing parallel conductive surfaces that are connected in turn by a resistor to a high impedance switch in the form of the gate of a field effect transistor. In the event that moisture vapor or dew is present in the control device, a conductive path is created that causes the control device to shut down in a safe or alternate mode from the normal mode of operation.

12 Claims, 3 Drawing Figures

Fig. 1 PRIOR ART
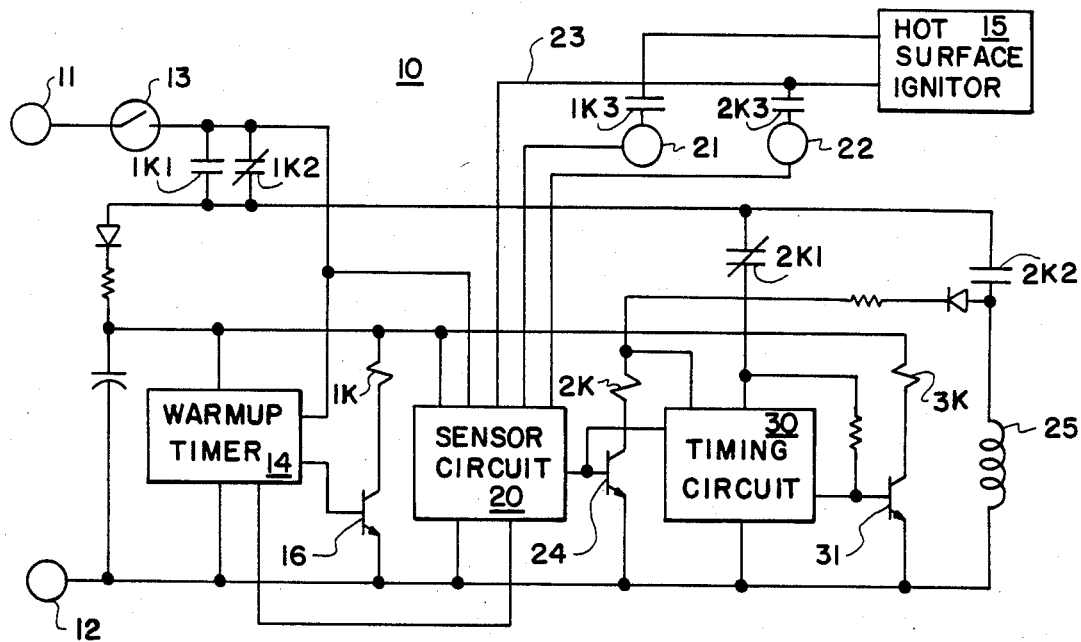
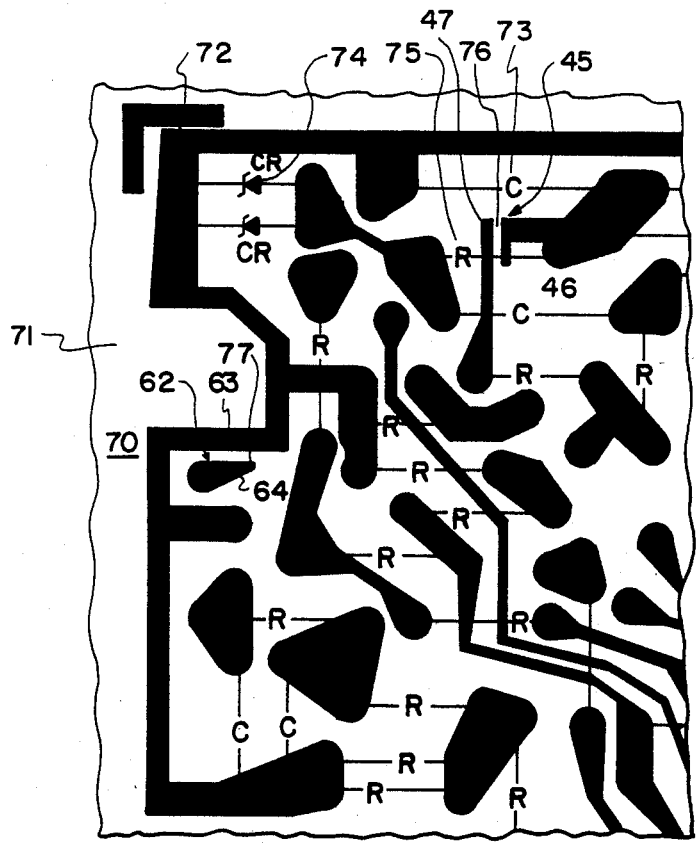
Fig. 3

PRINTED WIRING BOARD MEANS WITH INTEGRAL DEW SENSOR

BACKGROUND OF THE INVENTION

In the construction of electronic control devices it is common practice to use a printed wiring board which has an insulated surface that in turn supports a plurality of conductive surfaces as one element of the device's structure. The printed wiring board supports a number of electronic components that are interconnected by the printed wiring board conductive areas into an operable device. This type of structure, if exposed to a moist atmosphere, can fail due to condensation shorting out electrical paths between the conductive areas. In electronic control devices that have no safety function, this is an inconvenience, but not a safety problem. In devices that have safety functions, the shorting out of the conductive areas by moisture can create an unsafe mode of operation A typical type of control device that provides a safety function is a burner control apparatus in which the device is responsible for the safe ignition of a fuel, with subsequent monitoring of a flame. Typical of this type of device is an S89C Hot Surface Ignition Control as manufactured by Honeywell Inc. The S89C utilizes a hot surface ignitor which, when energized, ignites a gaseous fuel from a burner. The hot surface ignitor then acts as a flame rod to provide a flame rectification signal that monitors the presence of a flame at the burner. These types of units, if exposed to moisture, can have condensation on their printed wiring boards which short out circuitry that can cause the burner to issue forth fuel when no flame in fact exists. This type of problem has been encountered in installations in food processing locations. It is quite common in these environments for the control device to be exposed to atmospheric moisture or to the spray of water from clean up activities.

This type of problem can be readily solved by providing completely sealed electronic control devices, or by "potting" the device. Potting is a term used to generically refer to electronic equipment which has been filled with a plastic-like material that either becomes hard or semi-hard, but totally seals the device from moisture. The use of a totally water-tight enclosure or potting creates both a cost penalty, and a situation that makes repair of the device difficult or impossible.

SUMMARY OF THE INVENTION

The present invention is directed to an arrangement for providing an electronic control device with a dew sensor that disables the electronic control device in a safe manner. The dew sensor of the present invention allows for a normal mode of operation when moisture is not present within the device, but causes an alternate safe mode of operation in the event that an excessive amount of moisture is present within the device to an extent where it has condensed on the conductive areas of the printed wiring board to such a degree as to cause a leakage path between the conductive areas. The present invention is implemented in the form of a dew sensor which utilizes adjacent edges of two conductive areas of the printed wiring board pattern. The dew sensor structure is connected to the gate of a field effect transistor through a resistor, and is capable of driving the gate of the field effect transistor so as to cause the field effect transistor to shut down the electronic control device in the alternate safe mode of operation whenever moisture collects within the device due to condensation.

The present invention can be implemented by providing more than one dew sensor structure within a device so that more than one electronic control means can be operated to the alternate safe mode of operation. The present invention allows for the addition of a dew sensing function merely by providing an appropriate conductive pattern of the printed wiring board conductive areas, and the addition of a single resistor in the gate of the electronic control means or field effect transistor. The addition of the single resistor, and the organization of the conductive areas to provide the dew sensing function, adds little cost to the device The dew sensing function of the present invention is significantly different than the prior art dew sensing arrangements wherein discreet moisture sensitive elements are placed either external to a device, or internal to a device, to sense the presence of moisture. Moisture sensors have been used in alarm circuits, window controls, and controls to raise and lower blinds or tops on automobiles. These types of devices utilize discreet separate sensors and circuitry that is dedicated to the moisture control function. Also, dew sensors have been used as discreet elements within video tape recorders to disable the tape drive mechanisms in the event that moisture condensed in the unit.

In accordance with the present invention, there is provided an electronic control device which changes from a normal mode of operation to an alternate safe mode of operation in the event that excess moisture or vapor is present within said device, including: printed wiring board means that has an insulated surface that in turn supports a plurality of conductive areas; electronic components mounted by said printed wiring board means, and electrically interconnected by said conductive areas to provide an electronic circuit for said control device; said electronic components including at least one electronic control means having a plurality of electrodes connected to said conductive areas as part of said control device with said electronic control means having a plurality of states of conductivity; said conductive areas including at least one pair of spaced edges to form dew sensing means; and said pair of spaced edges of said dew sensing means being capable of connecting between one of said plurality of electronic control means electrodes and said electronic circuit; said dew sensing means changing impedance between said spaced edges with the presence of vapor at said dew sensing means to in turn cause said electronic control means to change said state of conductivity to cause said control device to change from said normal mode of operation to said alternate mode of operation.

BRIEF DESCRIPTION OF THE DRAWINGS

FIG. 1 is a block diagram of a typical hot surface ignition control;

FIG. 3 is a partial disclosure of a printed wiring board of the device of FIG. 2.

DESCRIPTION OF THE PREFERRED EMBODIMENT

Figure 2:
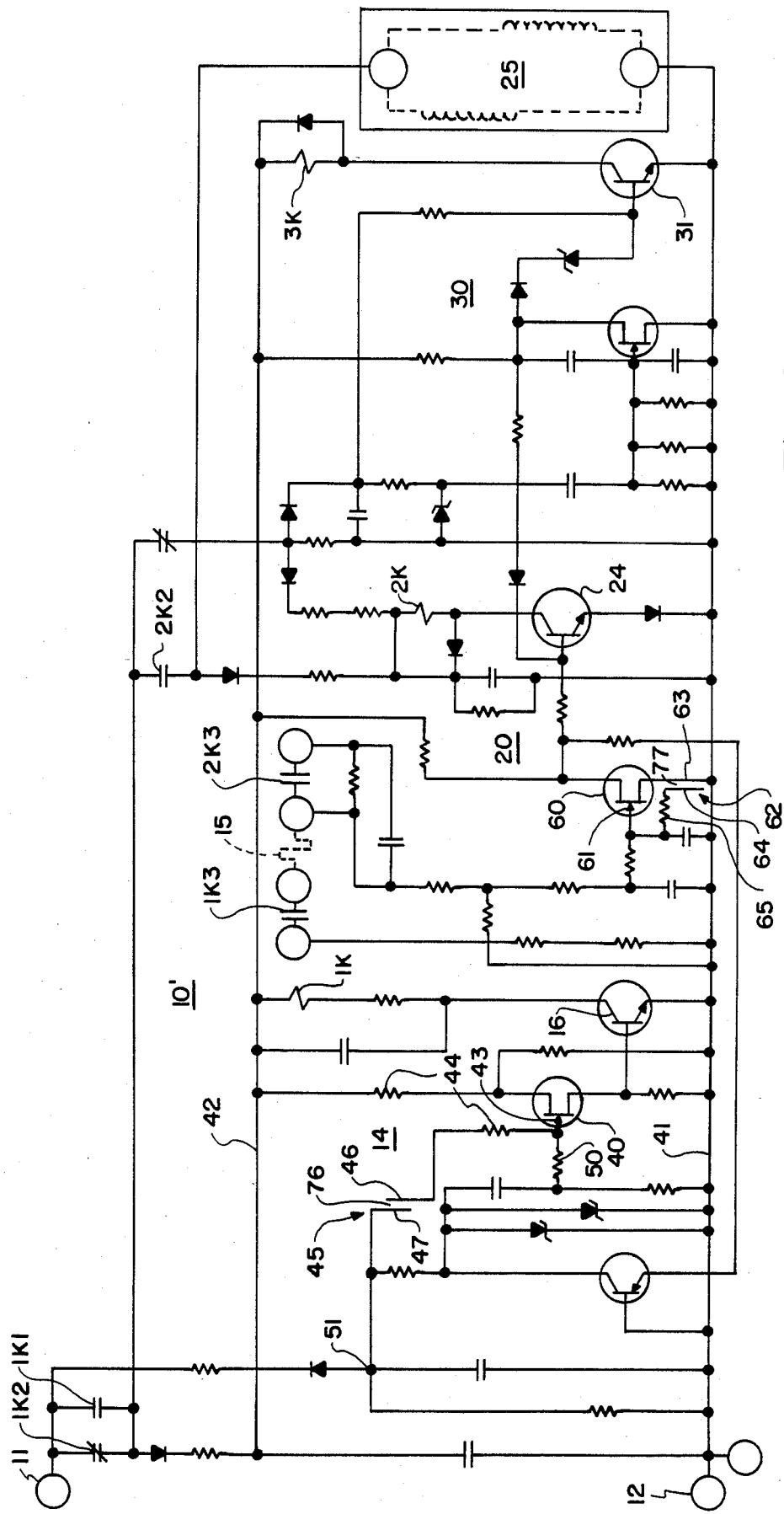
FIG. 2 is a detailed circuit diagram of a device disclosed in FIG. 1 with the invention also incorporated.

In FIG. 1 there is disclosed at 10 an electronic control device that could be a form of the previously mentioned S89C Hot Surface Ignition Control as manufactured by Honeywell Inc. The control device 10 is connected by terminals 11 and 12 to an appropriate source of power and is operated in response to a thermostat 13. Contained within the control device 10 is a warmup timer 14 that allows for a sufficient period of warmup of a hot surface ignitor element 15. The warmup timer 14 controls a transistor 16 that in turn is connected in series with a relay 1K. The relay 1K has a pair of relay contacts 1K1 and 2K1 that function as part of a safe start check and warmup function. Their detailed operation will not be explained as it is not directly pertinent to the invention, except to state that the state of the relay 1K determines in part whether the control device 10 can function safely.

The control device 10 further has a sensor circuit 20 that is connected to a pair of voltage terminals 21 and 22 which are in turn connected through relay contacts 1K3 and 2K3 to the hot surface ignitor 15. It is obvious that when the relay contacts 1K3 and 2K3 are closed, the hot surface ignitior 15 is connected to the voltage terminals 21 and 22 and can heat. If the contacts 1K3 and 2K3 are open circuited, as shown in the drawing, the hot surface ignitor 15 is connected by a conductor 23 to the sensor circuit 20, and acts as a flame rod. This function is a function contained in the S89C mentioned before. The sensor circuit 20 (along with a timing circuit 30) has an output transistor 24 that is connected in series with a relay 2K which has a pair of contacts 1K2 and 2K2. The 1K2 contact is a normally closed contact that acts as part of a safe start check circuit along with the relay contact 1K1. The contact 2K2 is used to energize a circuit to a gas valve or fuel valve disclosed at 25. Since the relay 2K controls the contact 2K2 that connects the fuel valve 25 to a source of power, it is quite apparent that the operation of the transistor 24 in energizing or de-energizing the relay 2K effectively controls the fuel valve 25.

The control device 10 is generally completed by the timing circuit 30 in turn having an output transistor 31 and an associated relay 3K. The relay 3K controls the two contacts 1K3 and 2K3 that energize and de-energize the hot surface ignitor 15.

In normal operation of the S89C type device, the closing of the thermostat 13 causes the warmup timer 14 to allow for the hot surface ignitor 15 to become energized for a set period of time. A safe start check is run which includes the relay contacts 1K1 and 1K2. After a sufficient warmup period of time has occurred, the timing circuit 30 operates the relay 2K to energize the contact 2K2 and open the gas valve o fuel valve 25. The hot surface ignitor 15 iqnites the fuel and is ready to act as a flame rectification sensor. The timing circuit 30 then causes the relay contacts 1K3 and 2K3 to open circuit which de-energizes the hot surface ignitor as an ignition element, and leaves it solely as a flame rectification device. The circuit operation just described basically is the type of circuit operation of the S89C of the Honeywell Hot Surface Ignition Control device. This type of device relies on a very small flame rectification signal on the conductor 23, and the device is being improved to avoid any possible problem with moisture. The device has been disclosed as a prior art device. The present invention is incorporated in this type of a prior art device, and will now be described in connection with the circuit of FIG. 2.

In FIG. 2 an electronic control device 10' is disclosed. It incorporates the present novel dew sensing arrangement. Only small portions of the circuit diagram will be specifically identified and will correspond with the circuit diagram of FIG. 1. Only the specific areas of the novel dew sensor means will be explained.

The energizing terminals 11 and 12 have been disclosed as supplying power to the control device 10'. Within this device is a warmup timer 14 that has an output control transistor 16 in series with the relay 1K. Within the warmup time of timer 14 is A field effect transistor 40 that has its source to drain connection between a ground conductor 41 and a source of potential conductor 42. The field effect transistor has a control gate 43 that in turn is connected through a resistor 44 to a dew sensor means generally disclosed at 45. The dew sensor means 45 includes a conductor 46 and a parallel conductor 47 that form part of a printed wiring board pattern, as will be disclosed in connection with FIG. 3. As long as no moisture is present at the dew sensor means 45, there is no conduction between the conductive surfaces 46 and 47, and the gate 43 of the field effect transistor 40 is effected solely by the signal supplied through a resistor 50 from other parts of the warmup timer 14.

If moisture becomes a problem, a collection of moisture across conductors 46 and 47 of the dew sensor means 45 causes a resistive path to exist between the gate 43 of the field effect transistor 40, the resistor 44, and a junction 51 of a potential source for the device. The sensor means 45 is effective when used with a high impedance switch means. As soon as conduction occurs due to moisture at the dew sensor means 45, the gate 43 of the field effect transistor 40 is clamped to potential that causes the field effect transistor 40 to be driven full off thereby stopping the current drive into the base for the transistor 16. This in turn overrides the normal control of the transistor 16, and in turn overrides the normal control of relay 1K. This locks the relay 1K in a safe condition so that the balance of the circuitry cannot allow fuel to flow through the fuel valve disclosed at 25.

The electronic control device 10' further has a sensor circuit 20 that corrsponds to the sensor circuit 20 of FIG. 1. The output control transistor 24, and the control relay 2K is again shown. It will be noted that the transistor 24 is dependent on the conductive state of a field effect transistor 60 that has a gate 61. It is obvious that when the field effect transistor 60 is conducting, the conduction effectively shorts out or grounds the base of transistor 24 thereby controlling its operation. A second dew sensing means 62 is disclosed as being madeup in part by the conductor 63 and the parallel conductor 64 that form part of the printed wiring board pattern, as will be shown in FIG. 3. The conductor 64 is connected through a resistor 65 to the gate 61 of the field effect transistor 60. Once again, if dew is present at the dew sensor means 62, a conductive path will be established through the resistor 65, the conductor 64, and the conductor 63 to the ground conductor 41. This effectively grounds the gate 60 of the field effect transistor 60 and overrides the control of the transistor 24 to cause the relay 2K to be de-energized thereby opening the contact 2K2 which removes power to the fuel valve 25.

The control device 10' is completed by a timing circuit 30 similar to the timing circuit disclosed in FIG. 1. The timing circuit 30 has an output transistor 31 that in turn controls the relay 3K. This timing circuit has been identified merely to provide identification so that a block diagram of FIG. 1 can be correlated with the complete diagram of FIG. 2.

No attempt has been made to describe all of the circuit components of FIG. 2 and their associated functions. Since the circuitry of FIG. 2 basically is contained in the prior art device of FIG. 1, except for the dew sensing means portions, only the dew sensing means portions have been described in any detail. In FIG. 3, the actual implementation of the dew sensing means structure on the printed wiring board will be described.

In FIG. 3 a portion of a printed wiring board means 70 is disclosed. The printed wiring board means 70 is of conventional sturcture having an insulated surface 71 upon which is placed a plurality of conductive areas 72. The conductive areas 72 have been identified as dark, patterned arrangements. Between the conductive areas, the general distribution of electronic components have been shown. For example, a capacitive element is shown at 73, a diode has been shown at 74 and a resistor has been shown at 75. No attempt is going to be made to identify all of the printed wiring board conductive area pattern. Only two areas, those areas which make up the dew sensor means, will be specifically identified. The dew sensor means 45 is identified by the two generally parallel conductive surface area 46 and 47. It will be noted that the parallel edges of the conductive surfaces 46 and 47 create a small spaced gap 76 that can be readily seen in FIG. 2 at the dew sensor means 45. It is apparent that in normal operation the gap 76 is insulated, but will change to a variable impedance or resistance if moisture condenses on the printed wiring board surface at 76. A conductive path caused by moisture between the elements 46 and 47, as previously explained, causes the field effect transistor 40 to operate in a safe mode for the device.

The second dew sensing means 62 is disclosed where the conductor 63, which forms part of the ground circuit for the device lies generally parallel to the conductive area 64. A gap 77 is created by the conductive areas 63 and 64, and this gap forms part of the dew sensing means 62 as disclosed in FIG 2. Once again, as long as no moisture is present on the printed wiring board surface, the circuit between the conductor 63 and 64 is an open circuit. If moisture condenses in the gap 77, the dew sensor means 62 causes the gate 61 of the field effect transistor 60 to take over the control of the device via the transistor 24 and the relay 2K.

It is apparent that as many dew sensing mean as are desired can be fabricated into a device by creating one or more pairs of parallel conductive areas that are in turn connected to the control elements of electronic control means, such as field effect transistors. The present disclosure shows two dew sensing means which are each individually capable of controlling the device in the event that moisture enters the control device 10'. It is quite apparent that one such dew sensing means could be used, or that more than two could be used by properly orienting conductive areas on the printed wiring board means and connecting these areas to the gates of the field effect transistors or to the electrodes of the individual transistors used elsewhere in the circuit. In view of the many modifications possible in the printed wiring board means and the circuitry, the applicants of the present invention wish the invention to be limited solely by the scope of the appended claims.

The embodiments of the invention in which an exclusive property or right is claimed are defined as follows:

1. An electronic control device which changes from a normal mode of operation to an alternate safe mode of operation in the event that excess moisture or vapor is present within said device, including: printed wiring board means that has an insulated surface that in turn supports a plurality of conductive areas; electronic components mounted by said printed wiring board means, and electrically interconnected by said conductive areas to provide an electronic circuit for said control device; said electronic components including at least one electronic control means having a plurality of electrodes connected to said conductive areas as part of said control device with said electronic control means having a plurality of states of conductivity; said conductive areas including at least one pair of spaced edges to form dew sensing means; and said pair of spaced edges of said dew sensing means being capable of connecting between one of said plurality of electronic control means electrodes and said electronic circuit; said dew sensing means changing impedance between said spaced edges with the presence of vapor at said dew sensing means to in turn cause said electronic control means to change said state of conductivity to cause said control device to change from said normal mode of operation to said alternate mode of operation.

2. An electronic control device as claimed in claim 1 wherein said spaced edges are generally parallel spaced edges.

3. An electrontic control device as claimed in claim 2 wherein said dew sensing means change in impedance is a change in resistance.

4. An electronic control device as claimed in claim 1 wherein said electronic control means is a field effect transistor; and said change in impedance of said dew sensing means in response to moisture is a change in resistance.

5. An electronic control device as claimed in claim 1 wherein said dew sensing means includes a resistor in series circuit with said one of said plurality of electrode means connected to said dew sensing means.

6. An electronic control device as claimed in claim 5 wherein said dew sensing means change in impedance is a change in resistance.

7. An electronic control device as claimed in claim 1 wherein said electronic control components include a plurality of electronic control means each having a plurality of electrodes connected to said conductive areas as part of said control device, and with said electronic control means each having a plurality of states of conductivity; said conductive areas including a plurality of pairs of spaced edges with each pair of said spaced edges forming a dew sensor; and each one of said electronic control means being connected to one of said dew sensors; said electronic control means conducting between said plurality of states of conductivity depending on the presence or absence of moisture at said dew sensors; moisture at said dew sensors causing said control device to change from said normal mode of operation to said alternate safe mode of operation.

8. An electronic control device as claimed in claim 7 wherein said spaced edges are generally parallel spaced edges.

9. An electronic control device as claimed in claim 8 wherein said dew sensors change in impedance is a change in resistance.

10. An electronic control device as claimed in claim 7 wherein said electronic control means each are field effect transistors; and said change in impedance of said dew sensors in response to moisture is a change in resistance.

11. An electronic control device as claimed in claim 7 wherein said dew sensors include a resistor in series circuit with one of said plurality of electrodes for each of said electronic control means connected to each of said dew sensors.

12. An electronic control device as claimed in claim 11 wherein said dew sensors change in impedance is a change in resistance.

* * * * *